(12) United States Patent
Lee et al.

(10) Patent No.: US 8,252,648 B2
(45) Date of Patent: Aug. 28, 2012

(54) POWER MOSFET DEVICE WITH SELF-ALIGNED INTEGRATED SCHOTTKY AND ITS MANUFACTURING METHOD

(75) Inventors: Yeeheng Lee, San Jose, CA (US); Yongping Ding, San Jose, CA (US); John Chen, Palo Alto, CA (US)

(73) Assignee: Alpha & Omega Semiconductor, Inc., Sunnyvale, CA (US)

( * ) Notice: Subject to any disclaimer, the term of this patent is extended or adjusted under 35 U.S.C. 154(b) by 248 days.

(21) Appl. No.: 12/826,591

(22) Filed: Jun. 29, 2010

(65) Prior Publication Data

US 2011/0316076 A1 Dec. 29, 2011

(51) Int. Cl.
*H01L 21/336* (2006.01)

(52) U.S. Cl. .... 438/270; 438/454; 438/925; 257/E21.41

(58) Field of Classification Search ............ 438/270, 438/454, 925; 257/E21.41
See application file for complete search history.

(56) References Cited

U.S. PATENT DOCUMENTS

| | | | | |
|---|---|---|---|---|
| 6,251,730 B1 * | 6/2001 | Luo | | 438/270 |
| 6,882,005 B2 * | 4/2005 | Disney | | 257/328 |
| 7,446,374 B2 * | 11/2008 | Thorup et al. | | 257/330 |
| 7,459,366 B2 * | 12/2008 | Banerjee et al. | | 438/270 |
| 7,465,986 B2 * | 12/2008 | Girdhar et al. | | 257/330 |
| 7,566,931 B2 * | 7/2009 | Kocon | | 257/328 |
| 2003/0209757 A1 * | 11/2003 | Henninger et al. | | 257/329 |
| 2006/0292764 A1 * | 12/2006 | Harada | | 438/156 |
| 2011/0133258 A1 * | 6/2011 | Chen | | 257/288 |
| 2012/0068231 A1 * | 3/2012 | Garnett | | 257/263 |

* cited by examiner

*Primary Examiner* — Jarrett Stark
*Assistant Examiner* — John M Parker
(74) *Attorney, Agent, or Firm* — Chein-Hwa Tsao; CH Emily LLC

(57) ABSTRACT

A power MOSFET device and manufacturing method thereof, includes the steps of selectively depositing a first conductive material in the middle region at the bottom of a contact trench and contacting with light-doped N-type epitaxial layer to form a Schottky junction and depositing a second conductive material at the side wall and bottom corner of the contact trench and contacting with P-type heavy-doped body region to form an ohmic junction. The first and second conductive materials can respectively optimize the performance of the ohmic contact and the Schottky contact without compromise. Meanwhile, the corner of the contact trench is surrounded by P-type heavy-doped region thereby effectively reducing the leakage currents accumulated at the corner of the contact trench.

11 Claims, 7 Drawing Sheets

POWER MOSFET DEVICE WITH SELF-ALIGNED INTEGRATED SCHOTTKY AND ITS MANUFACTURING METHOD

TECHNICAL FIELD

This invention relates to a power MOSFET device and manufacturing method thereof, in particular to a power MOSFET device with a Schottky contact to the drift region and an ohmic contact to the body region in a same contact trench utilizing conductive materials with different characteristics and the manufacturing method thereof.

BACKGROUND TECHNOLOGY

FIG. 1 shows the structure diagram of an existing power MOSFET (metallic oxide semiconductor field effect transistor) device. Taking as example of an n channel device, the MOSFET of FIG. 1 comprises an n– epitaxial layer 200 grown on top of an n+ bottom substrate; a plurality of trench gates 310 are disposed inside trenches etched into the n-epitaxial layer 200; and a gate insulation layer 320 is arranged at the sidewall and bottom of the trench so as to insulate the gate from the n– epitaxial layer 200. A p-type body region 400 is formed from the top of the n– epitaxial layer 200 surrounding the trench gates 310. A n++ source 450 is also formed from the top of the n– epitaxial layer 200 into the body region 400. A dielectric layer 500 comprising a low-temperature oxide and a boron-phosphorosilicate glass is also deposited on the top surfaces the trench gates 310 and the source region 450.

A plurality of contact trenches 600 (only one shown) penetrating through the dielectric layer 500, the source region 450 and the body region 400 are formed through etching. The bottoms of the contact trenches extend into the epitaxial layer 200. A potential barrier layer 700 formed by metal material is deposited on the top surface of the dielectric layer 500 as well as the side wall and bottom surface of the contact trench 600. A contact metal layer 800 is deposited overlaying the potential barrier layer 700. The contact metal layer 800 fills in the contact trench 600 and extends over the top surface of the dielectric layer 500. The contact metal layer 800 and the potential barrier layer 700 are subsequently patterned to form the electrodes of the semiconductor device.

An ohmic contact is formed on the sidewalls of the contact trench between potential barrier layer 700 and the P-doped body region 400 due to the contact of metal-semiconductor; while a Schottky contact is formed at the bottom of contact trench between the potential barrier layer 700 and the light-doped epitaxial layer 200. Wherein the ohmic contact has the characteristics of small resistance and symmetric linearity of I-V (current-voltage) curves, in general, if a conductive material (such as Pt, work function 5.65 eV) with higher work function is used in contact with the semiconductor in the potential barrier layer 700, the potential barrier height between the conductive material and the semiconductor can be reduced to resulting in smaller contact resistance of the ohmic contact. However, the Schottky contact has the I-V curve with diode characteristic in general, if a conductive material with medium work function is used in combination with doping concentration adjustment of the semiconductor, the rectification effect of the Schottky contact can be improved.

However, for the existing power MOSFET device of FIG. 1, the ohmic contact formed at the side surface of the potential barrier layer 700 and the Schottky contact formed at the bottom of the potential barrier layer 700 share the same potential barrier layer 700. Although the potential barrier layer 700 may utilize conductive materials with high work function to achieve the characteristic of small resistance of the ohmic contact, the performance of the Schottky contact will be sacrificed as the high work function conductive material requires a higher forward voltage to conduct. A trade off is usually necessary in making an ohmic contact and a Schottky contact using the same conductive material.

In addition, as shown in the dotted portion of FIG. 1, the bottom corner of the contact trench 600 is not surrounded by body region 400; instead, the bottom corner is contacted with the epitaxial layer 200 to form the Schottky contact; phenomenon of centralized electric fields can exist in the edge corner of the bottom Schottky contact leading to a large reverse leakage current at the bottom corner of the contact trench 600.

SUMMARY OF THE INVENTION

This invention aims at providing a power MOSFET device and manufacturing method thereof, which can reduce reverse leakage current by surrounding the bottom corner of a contact trench with a body region, and improve the characteristics of a Schottky contact and an ohmic contact without trade off by using different conductive materials with different work functions to form the Schottky contact and ohmic contact respectively with a semiconductor.

In order to achieve the aims, this invention discloses a power MOSFET device comprising:

An epitaxial layer disposed on a bottom substrate;

A trench gate formed in a trench opened into the epitaxial layer;

A body region formed from a top surface of the epitaxial layer into the epitaxial layer and surrounding the trench;

A source region formed from the top surface of the epitaxial layer (20) into a top portion of the body region and surrounding the trench;

A dielectric layer on the top surfaces of the trench gate and the source region;

A contact trench opened through the dielectric layer and the source region;

Wherein a bottom of the contact trench terminates at a depth shallower than a bottom of the body region, with bottom corners of the contact trench surrounded by the body region and a central portion of the contact trench bottom exposing a drift region; wherein a first conductive material disposed over the central portion of the contact trench bottom forming a Schottky junction with the drift region and a second conductive material lining over a sidewall and the bottom corners of the contact trench forming ohmic contacts with the body region.

In one embodiment, the power MOSFET device further comprises a third conductive material layer filling in the contact trench and extending over the top surface of the dielectric layer.

In another embodiment the second conductive material filling in the contact trench and extending above the top surface of the dielectric layer.

In another embodiment a region of the body region surrounding the sidewall of the contact trench comprises dopants of body type higher in density than the rest of the body region.

In another embodiment a region of the body region surrounding the bottom corner of the contact trench comprises dopants of body type higher in density than the rest of the body region.

In another embodiment the edges of the first conductive material spaces away from the bottom corners of the contact trench.

In another embodiment the second conductive material separates the edges of the first conductive material away from the bottom corners of the contact trench.

A manufacturing method for power MOSFET device is characterized by comprising the following steps:

a. Forming an epitaxial layer lightly doped with dopants of first conductivity on a bottom substrate heavily doped with dopants of the first conductivity;

b. Implanting dopants of second conductivity into the epitaxial layer to form a body region;

c. Forming a trench gate in the epitaxial layer;

d. Implanting dopants of first conductivity in an upper part of the epitaxial layer to form a heavily doped source region;

e. Forming a dielectric layer on top of the epitaxial layer;

f. Etching a contact trench through the dielectric layer and the source region into the body region in the epitaxial layer;

h. forming sidewall spacers along the sidewalls and bottom corners of the contact trench;

j. Depositing a first conductive material at a central portion of the bottom of the contact trench not covered by the spacer;

m. Depositing a contact metal layer filling the contact trench and overlaying the dielectric layer.

In one embodiment the method further comprising a step (g) of implanting dopants of second conductivity into sidewalls and bottom corners of the contact trench with an angle before forming spacers along the sidewalls and bottom corners of the contact trench region.

In another embodiment the method further comprising a step (i) of implanting dopants of first conductivity into the bottom of the contact trench after the formation of spacers using the spacers as a mask.

In another embodiment wherein step (h) of forming spacer further comprises steps of depositing a dielectric material inside the contact trench and anisotropicaly etch back to form spacers along the sidewalls and the bottom corners of the contact trench and exposing the central portion of the bottom of the contact trench.

In another embodiment the method further comprises a step (k) of removing the spacers after the step of depositing the first conductive material in the central portion of the bottom of the contact trench.

In another embodiment the method further comprises a step (l) of depositing a second conductive material along the sidewalls and bottom corners of the contact trench to form ohmic contact with the body region before deposition of the contact metal layer.

In another embodiment wherein step (h) of forming spacer further comprises steps of depositing a second conductive material inside the contact trench and anisotropicaly etch back to form spacers along the sidewalls and the bottom corners of the contact trench and exposing the central portion of the bottom of the contact trench.

In one embodiment the first conductive material comprises a silicide layer of Ti, Ta, Ni, etc.

In another embodiment the first conductive material forms a Schottky contact with a doped region of first conductivity right under the central portion of the contact trench.

In another embodiment the second conductive material comprises a WSi2 or a doped poly silicone.

DETAIL DESCRIPTION OF THE DRAWINGS

A plurality of implementation modes of this invention are described by combination with the attached Figures below.

Embodiment 1

Figure 1:
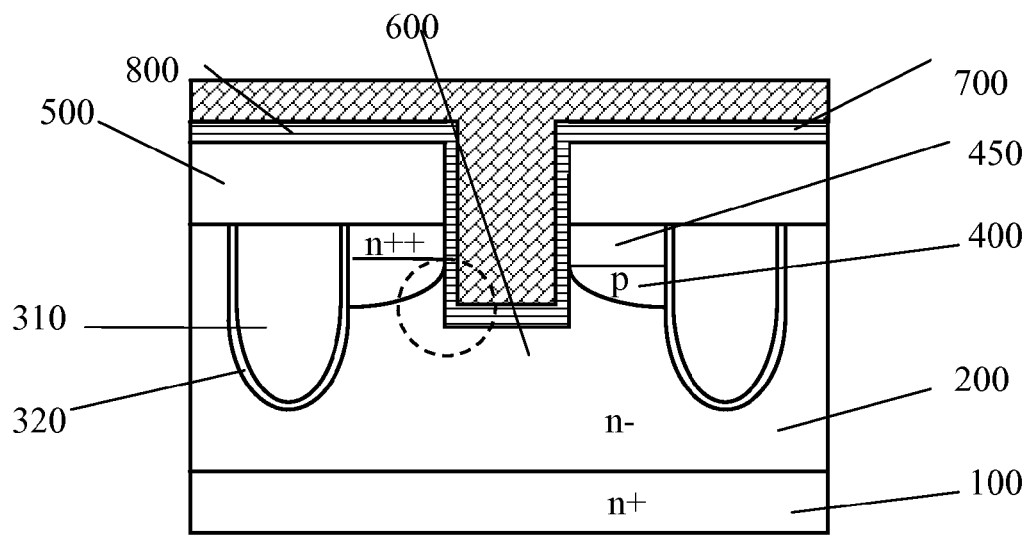
FIG. 1 is a cross sectional view of a power MOSFET device provided by prior art.
Figure 2:
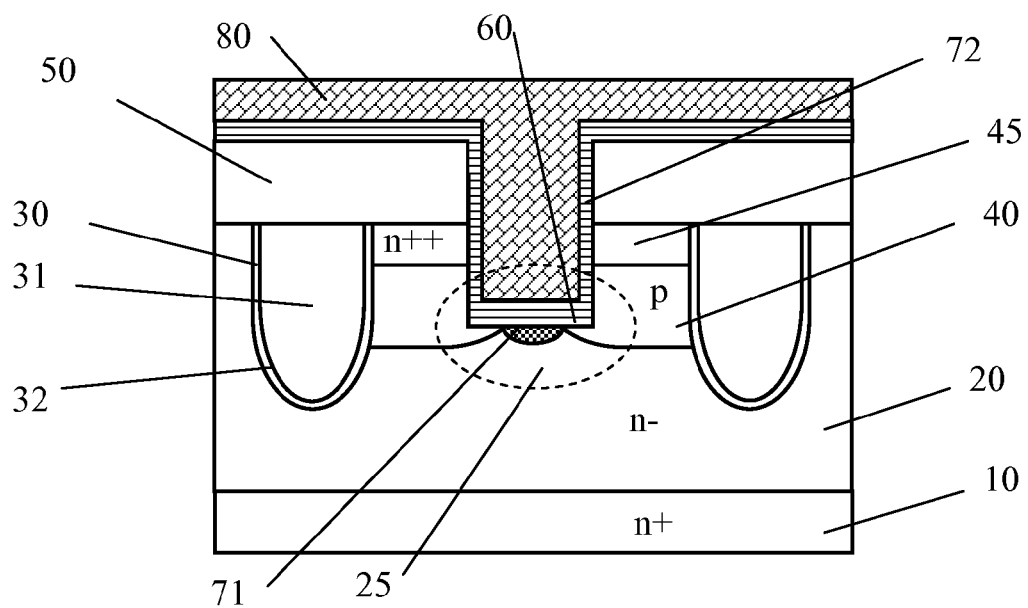
FIG. 2 is a cross sectional view of a power MOSFET device of this invention according to a first embodiment.

FIG. 2 is a cross sectional view of the power MOSFET device of this invention. Using n-channel power MOSFET device as an example, the power MOSFET device comprises an n+ heavy-doped bottom substrate 10 and an n− epitaxial layer 20 disposed on top of the bottom substrate 10 with a plurality of trenches 30 extending into the epitaxial layer 20 by a certain depth. The trench is filled with conductive materials such as doped polysilicon so as to form trench gate 31 with thin oxide layer formed along the side wall and bottom of the trench as gate insulation layer 32 to isolate the trench gates 31 and the epitaxial layer 20. A p type body region 40 is also formed from the top of the epitaxial layer 20 and surrounding the trench gates 31. A n++ source region 45 is formed through ion implantation from the top of the body region surrounding the trench gate. The body region 40 and the source region 45 are isolated from the trench gates 31 through the gate insulation layer 32. A dielectric layer 50 comprising a low-temperature oxide and a boron-phosphorosilicate glass is deposited on the top surfaces of the epitaxial layer 20, the trench gates 31 and the source region 45, and is used for isolating the trench gates 31 from contact between the body region 40 and the source region 45.

A plurality of contact trenches 60 (only one shown) are etched through the dielectric layer 50 and extend into the body region 40 in the epitaxial layer 20 such that the bottom corners of the contact trench 60 are surrounded by the p type body region while a central portion of the bottom of the contact trench 60 is in contact with an n− region in epitaxial layer 20. A first conductive material layer 71 (also referred to as Schottky contact layer) comprising a Schottky barrier metal is deposited in the central portion of the bottom of the contact trench 60 therefore forming a Schottky junction with the n− epitaxial layer 20. An ohmic contact with the source and body regions is established by depositing a second conductive material layer 72 (also referred to as ohmic contact layer) on the top surface of the dielectric layer 50, the sidewalls and the bottom corners of the contact trench 60 and the Schottky contact layer 71. A contact metal layer 80 is also deposited overlaying the entire second conductive material layer 72 filling the contact trench 60 and extending above the top surface of the dielectric layer 50.

The Schottky contact layer 71 and the ohmic contact layer 72 are respectively manufactured using metal materials with different work functions. The ohmic contact layer 72 manufactured by metal with high work function is used to contact with the p type body region 40 at the sidewall surface and bottom corners of the contact trench 60 to form the ohmic contact; in the embodiment, for example, metals such as Pt with a work function of 5.65 eV, or Ni with a work function of 5.15 eV, or WSi2 with a work function of 5.1 eV can be used to prepare the ohmic contact layer 72 to reduce the contact resistance.

Figure 7:
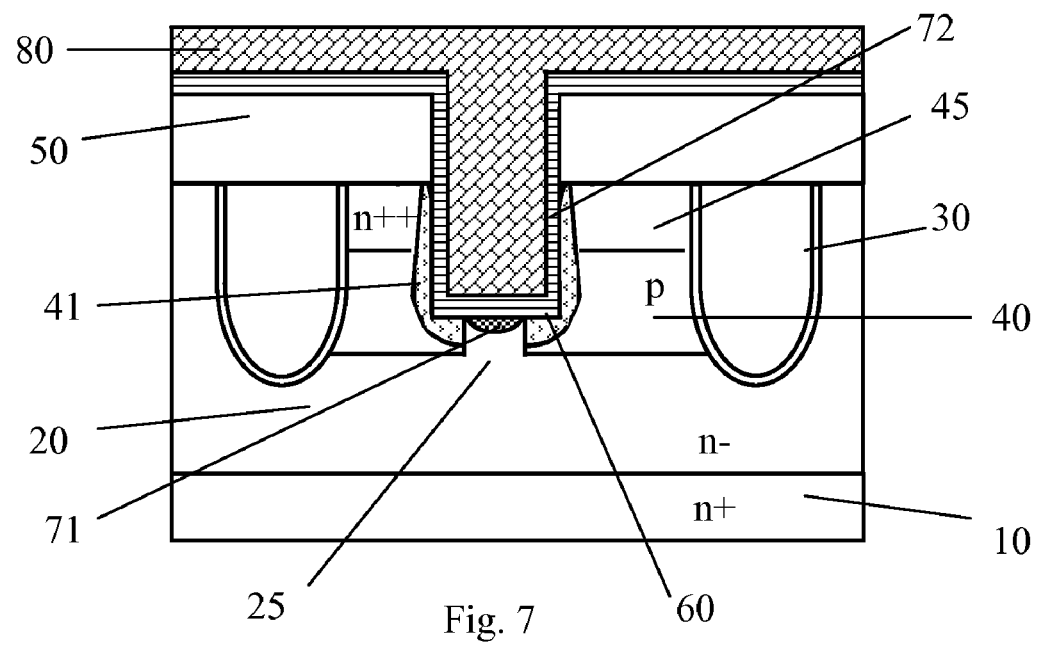

The Schottky contact layer 71 may be manufactured by a metal with medium work function in contact with the light-doped n-type epitaxial layer 20 at the middle position of the bottom of the contact trench 60 to form the Schottky contact; in the embodiment, for example, metals such as Ti with a work function of 4.33 eV, or Ta with a work function of 4.2 eV can be used to prepare the Schottky contact layer 71 to improve the rectification effect of the formed Schottky junction As shown in the FIG. 7, in a preferred embodiment, a heavy p-type doped region 41 may be formed in the p type body region 40 surrounding the sidewalls and the bottom corner of the contact trench 60 to further improve the ohmic contact to the p body region. B+ boron ions may be implant with an angle to form heavily doped P-type region 41. In one embodiment, the body region surrounding the sidewall of the contact trench comprises dopants of body type higher in density than the rest of the body region; in another embodiment the body region surrounding the bottom corner of the contact trench comprises dopants of body type higher in density than the rest of the body region.

Figure 3:
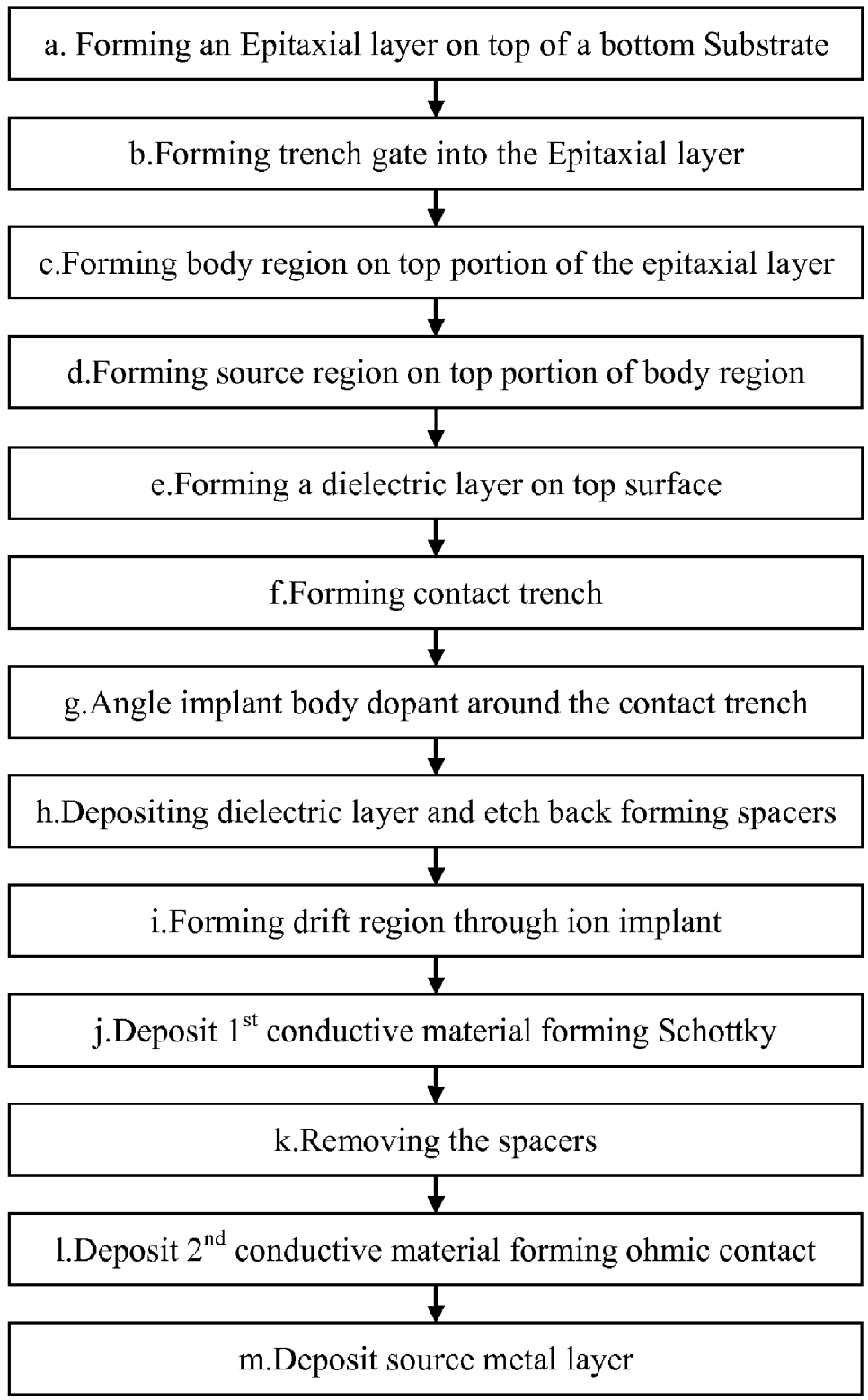
FIG. 3 is a process flow chart of manufacturing the power MOSFET device of FIG. 2.

The manufacturing method for the power MOSFET device provided with the B+ boron p-type heavy doped region 41 is shown in FIG. 3 to FIG. 7; wherein FIG. 3 is the flow chart of the manufacturing method.

At first, the n− epitaxial layer 20 is grown on top of the n+ heavy-doped bottom substrate 10 in step (a). In step (b) a hard mask for trench 30 is formed by SiO2 on the surface of the n− epitaxial layer 20 and the trench 30 is anisotropically etched into the n− epitaxial layer 20 to a preset depth. The gate insulation layer 32 usually formed by thermal oxide is formed along the side wall and bottom of the trench 30 after standard sacrificial oxide layer growing and etching procedures. After that an n+ doped polysilicon is deposited to fill in the space of the trench 30 and on top of the hard mask of the SiO2. Then an etch back process is implemented to remove the n+ doped polysilicon on the hard mask of the SiO2 so as to form the trench gate 31 inside trench 30 and the hard mask for the trench 30 is then peeled off by etching.

In the steps (c) to (d), the p type body region 40 is formed in the top part of the n− epitaxial layer 20 by implanting p type dopants into the n− epitaxial layer 20 with or without a mask followed by implanting N+ dopants into the top portion of the body region with or without a mask to form the source region 45 surrounding the gate insulation layer 32 in the trench 30. Alternatively these steps can be carried out before the trench 30 is etched with or without a mask. In the step (e), the dielectric layer 50 of the low-temperature oxide and boron-phosphorosilicate glass is deposited in sequence on top of the trench gate 31 and the n− epitaxial layer 20 to insulate the trench gate 31. In step (f), contact trench 60 is etched penetrating through the dielectric layer 50 and the source region 45 into the body region 40 such that the bottom corners of the contact trench 60 being surrounded by the p type body region 40.

Figure 4:
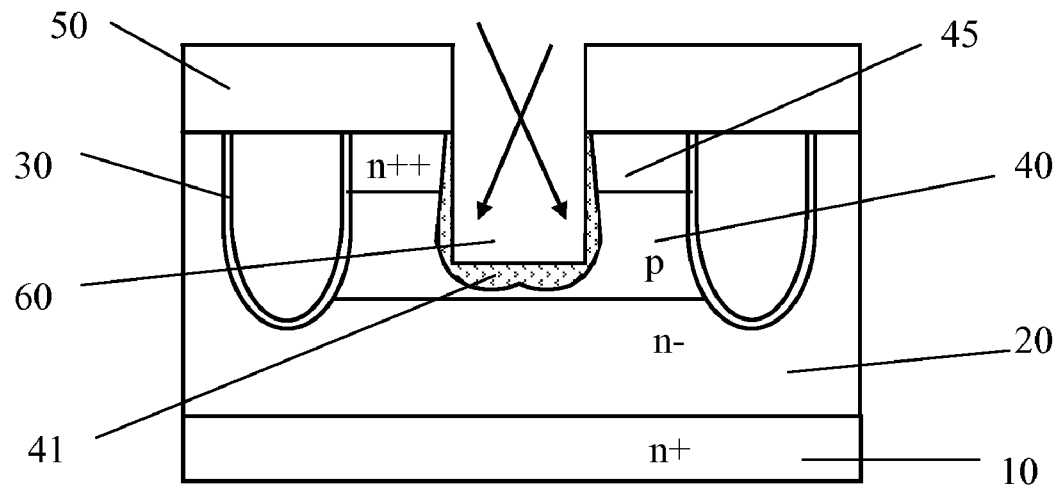
FIG. 4 to FIG. 7 are cross sectional views in steps of making the power MOSFET device according to the process flow of FIG. 3.

As shown in the FIG. 4, B+ boron implant is carried out to form heavily doped p+ region 41 surrounding the sidewalls and bottom corners of the contact trench 60 in the p type body region 40 through ion implant with an angle in step (g). In one embodiment, the body region surrounding the sidewall of the contact trench is implanted dopants of body type higher in density than the rest of the body region; in another embodiment the body region surrounding the bottom corner of the contact trench is implanted dopants of body type higher in density than the rest of the body region.

Figure 5:
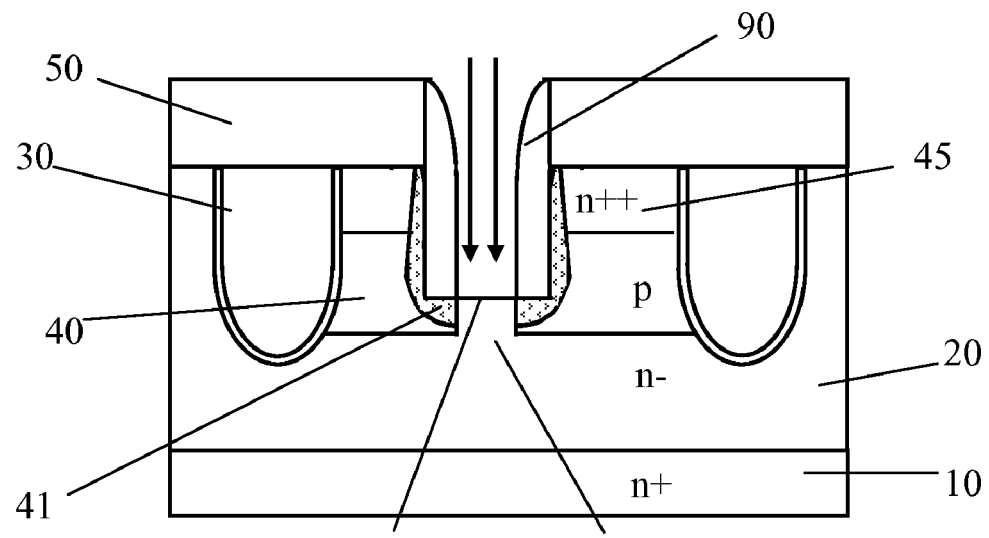

As shown in the FIG. 5, in step (h) a spacer layer 90 is formed by depositing non-conducting materials such as SiO2 or SiN through chemical vapor deposition method followed by an anisotropic etch to form the spacer layer 90 covering the sidewalls of the contact trench 60 as well as the bottom corners of the contact trench 60 to reveal the surface of the middle region at the bottom of the contact trench 60.

Then in step (i), the spacer layer 90 is used as the mask to space away the B+ p-type region 41 and the p type body region 40 along the sidewalls and at the bottom corners of the contact trench 60 from N type ion implantation into the central portion of the bottom of the contact trench to form an N− drift region 25 right under the central portion of the bottom of the contact trench connecting to the n− epitaxial layer 20 to ensure that N type dopant region extends from the bottom of N+ substrate 10 reaching to the central bottom portion of the contact trench. As shown in FIG. 5, the central portion of the bottom of the contact trench 60 is contacted with the n− epitaxial layer 20 through drift region 25; while the bottom corners of the contact trench 60 are surrounded by the B+ boron P type region 41 in the P type body region 40.

Figure 6:
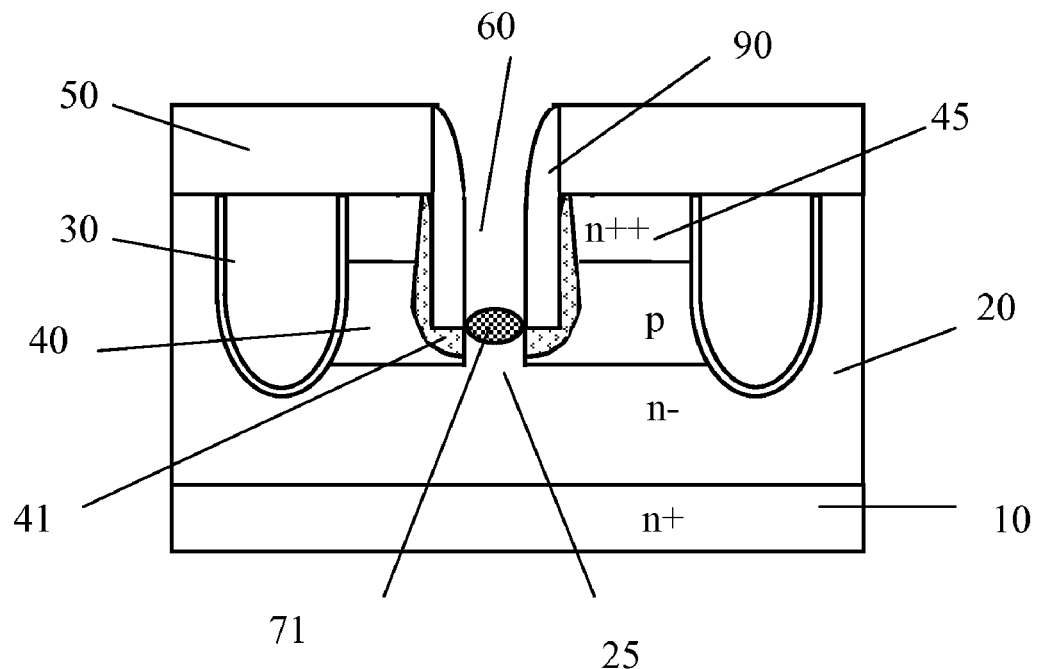

As shown in FIG. 6, the spacer 90 is also used as a mask in step (j) where a first metal with medium work function is deposited on the central portion of the bottom of the contact trench 60 in contact with drift region 25 to form the Schottky contact layer 71. In one embodiment, a metal such as Ti or Ta is deposited on the top of the dielectric layer 50 as well as on the sidewalls of the spacer 90 and the central bottom portion of the contact trench. The deposited Ti or Ta metal reacts with Si in the central bottom portion to form a silicide at an elevate temperature while the Ti or Ta metal overlaying dielectric layer 50 and spacer 90 remains unchanged and is removed in a following etching process, leaving only silicide as a first conductive material in the central bottom portion of the contact trench to form the Schottky contact layer 71 with the N drift region 25 with improved rectification effect.

As shown in the FIG. 7, the non-conducting spacer layer 90 is removed in step (k) through wet cleaning technique; then in the step (l), a second conductive material such as a metal with high work function is deposited on the top surface of the dielectric layer 50, the sidewalls and the bottom corners of the contact trench 60 previously occupied by the spacer 90, as well as on top of the Schottky contact layer 71. The second conductive material forms ohmic contacts on the sidewalls and the bottom corners of the contact trench with the p type body region 40 or heavily doped p+ regions 41. As stated above, in the embodiment, metal like Pt, or Ni, or WSi2 can be used to form the ohmic contact layer 72 with improved contact resistance.

In the step (m), the contact metal layer 80 is also deposited overlaying the second conductive material layer 72 to fill in the contact trench 60 and extend above the top surface of the dielectric layer 50. After that, manufacturing of the whole power MOSFET device provided with the B+ boron p-type region 41 can be finished according to standard procedure.

Alternatively the manufacturing of the structure shown in FIG. 2 without p+ region 41 surrounding the side wall and the bottom corners of the contact trench 60 can follow the same step of process by skipping step (g).

Embodiment 2

Figure 12:
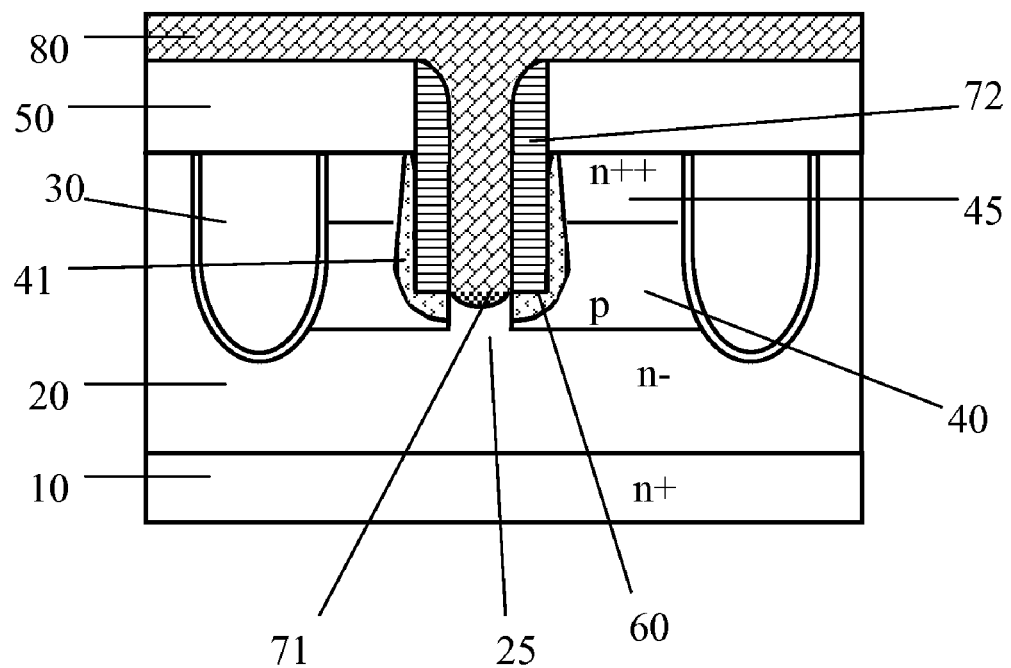

As shown in the FIG. 12, the power MOSFET device in this embodiment is similar to the structures in the embodiment 1, in that, the N channel power MOSFET device comprises an n+ bottom substrate 10 and an n− epitaxial layer 20 on top of the bottom substrate 10; a plurality of trenches extend into the n− epitaxial layer 20 filled with conductive materials forming a trench gate 31; and a gate insulation layer 32 is arranged to isolate the gate from the epitaxial layer 20. A p type body region 40 is formed from the top surface of the epitaxial layer 20 surrounding the trench gate 31, A n+ source region 45 is formed from the top surface of the epitaxial layer 20 into a top portion of the body region surrounding the trench gate 31; a dielectric layer 50 comprising a low-temperature oxide and a boron-phosphorosilicate glass is also deposited on the top surfaces of the epitaxial layer 20, the trench gates 31 and the source region 45; a plurality of contact trenches 60 (only one shown) are etched through the dielectric layer 50 and extend into the body region 40 in the epitaxial layer 20 such that the bottom corners of the contact trench 60 are surrounded by the p type body region while a central portion of the bottom of the contact trench 60 is in contact with an n− region in epitaxial layer 20. A first conductive material layer 71 is deposited on the central bottom portion of the contact trench 60 between the conductive spacer pair layer 72" at the bottom of the contact trench 60 forming a Schottky contact with the N type region 25 underneath the central bottom portion of the contact trench 60 and connecting to the n− epitaxial layer 20. The first conductive material can be a metal with medium work function such as Ti, Ta, etc, of which a silicide can be formed to improve the rectification characteristic of the Schottky contact. The edge of Schottky contact is space away from the bottom corner of the contact trench 60.

The only difference is that this second embodiment also comprises a pair of conductive spacer layer 72' formed of a second conductive material layer 72 covering the side wall and bottom corners of the contact trench 60 forming ohmic contact with the heavily doped p+ region 41 inside body region 40. The second conductive material forming the conductive spacer layer 72' only covers the sidewalls and bottom corners of the contact trench without extending over the first conductive material forming Schottky contact and fills a space between the bottom corner of the contact trench 60 and the edge of the Schottky contact formed by the first conductive material and the n type doped region 25 underneath. The second conductive material of layer 72 may be a conductive material such as WSi2, p+ doped polysilicon, etc., having high work function characteristics to improve the contact resistance of the ohmic contact.

Moreover, a contact metal layer 80 is also deposited overlaying the second conductive material 72 at the sidewalls and bottom corners of the contact trench 60 and the first conductive material 71 in the middle region at the bottom of the contact trench 60. The contact metal layer fills in the contact trench 60 and extends over the top surface of the dielectric layer 50.

In the preferred embodiment shown in FIG. 12, a B+ boron P-type heavy doped region 41 is provided surrounding the ohmic contact in the p type body region 40 along the sidewalls and the bottom corners of the contact channel 60 to improve contact resistance to the body region 40. In one embodiment, the body region surrounding the sidewall of the contact trench is implanted dopants of body type higher in density than the rest of the body region; in another embodiment the body region surrounding the bottom corner of the contact trench is implanted dopants of body type higher in density than the rest of the body region. Alternatively the heavy doped region 41 may be absent if the doping level in P body region is high enough.

Figure 8:
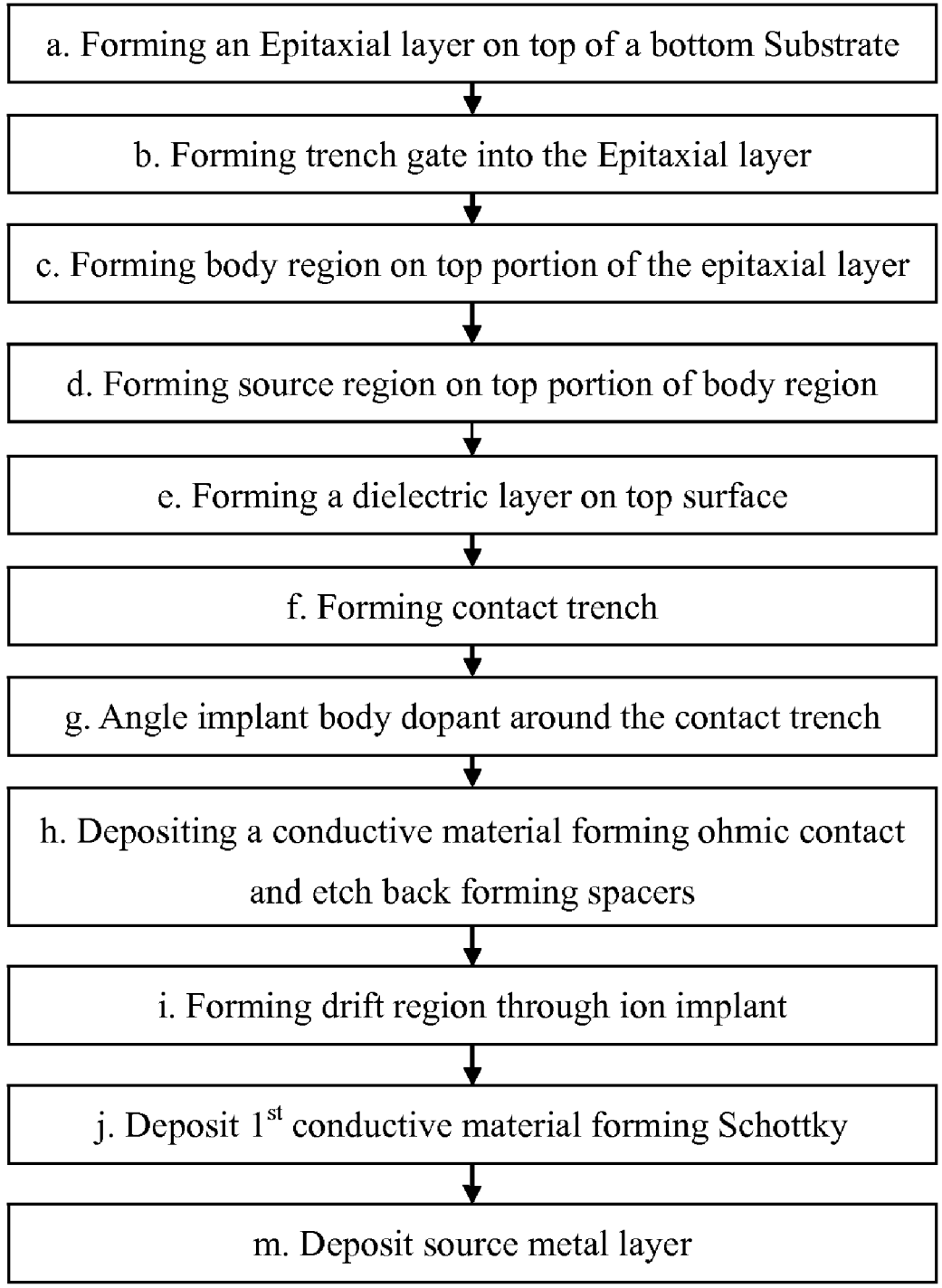
FIG. 8 is a process flow chart of manufacturing a power MOSFET device of this invention according to a second embodiment.

The manufacturing method for the power MOSFET device provided with the heavily doped p-type region 41 is described by FIG. 8 to FIG. 12; wherein FIG. 8 is the process flow chart of the manufacturing method.

Similar to the process of the first embodiment, the n− epitaxial layer 20 is grown on top of the n+ heavy-doped bottom substrate 10 in step (a). In step (b) a hard mask for trench 30 is formed by SiO2 on the surface of the n− epitaxial layer 20 and the trench 30 is anisotropically etched into the n− epitaxial layer 20 to a preset depth. The gate insulation layer 32 usually formed by thermal oxide is formed along the side wall and bottom of the trench 30 after standard sacrificial oxide layer growing and etching procedures. After that an n+ doped polysilicon is deposited to fill in the space of the trench 30 and on top of the hard mask of the SiO2. Then an etch back process is implemented to remove the n+ doped polysilicon on the hard mask of the SiO2 so as to form the trench gate 31 inside trench 30 and the hard mask for the trench 30 is then peeled off by etching.

In the steps (c) to (d), the p type body region 40 is formed in the top part of the n− epitaxial layer 20 by implanting p type dopants into the n− epitaxial layer 20 with or without a mask followed by implanting n+ dopants into the top portion of the body region with or without a mask to form the source region 45 surrounding the gate insulation layer 32 in the trench 30. Alternatively these steps can be carried out before the trench 30 is etched with or without a mask. In the step (e), the dielectric layer 50 of the low-temperature oxide and boron-phosphorosilicate glass is deposited in sequence on top of the trench gate 31 and the n− epitaxial layer 20 to insulate the trench gate 31. In step (f), contact trench 60 is etched penetrating through the dielectric layer 50 and the source region 45 into the body region 40 such that the bottom corners of the contact trench 60 being surrounded by the p type body region 40.

Figure 9:
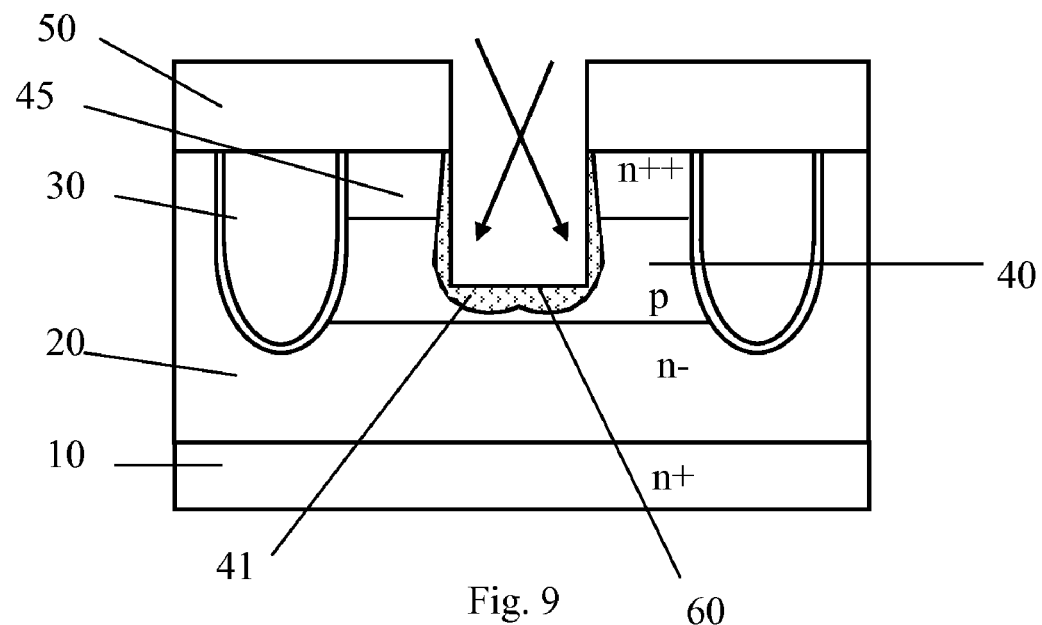
FIG. 9 to FIG. 12 are cross sectional views in steps of manufacturing the power MOSFET device of this invention according to the second embodiment.

As shown in the FIG. 9, B+ boron implant is carried out to form heavily doped p+ region 41 surrounding the sidewalls and bottom corners of the contact trench 60 in the p type body region 40 through ion implant with an angle in step (g). In one embodiment, the body region surrounding the sidewall of the contact trench is implanted dopants of body type higher in density than the rest of the body region; in another embodiment the body region surrounding the bottom corner of the contact trench is implanted dopants of body type higher in density than the rest of the body region.

Figure 10:
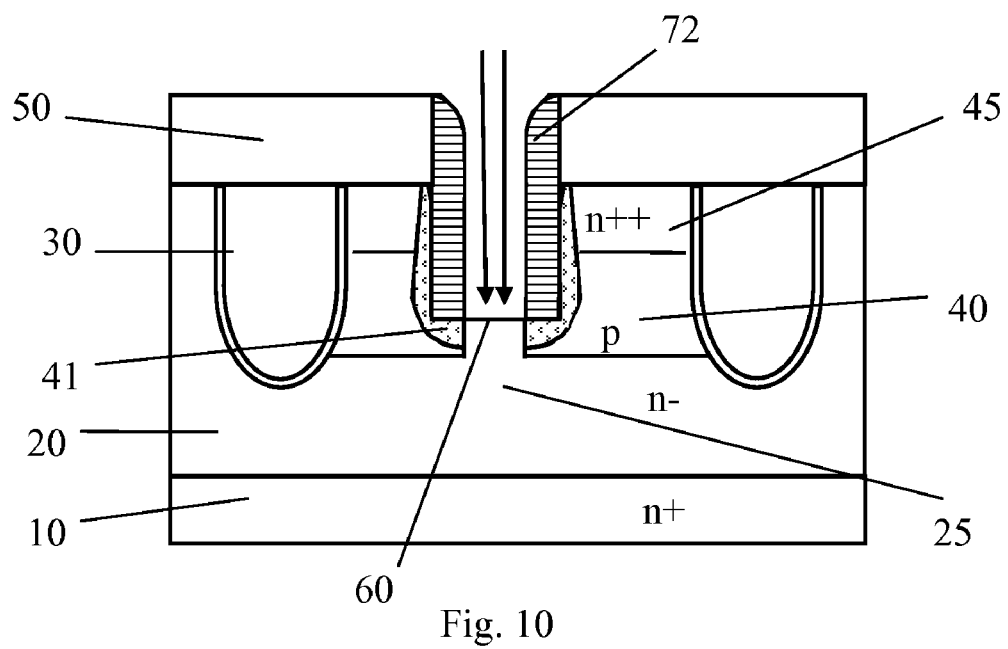

The process of making embodiment 2 is different from that of making embodiment 1 in step (h); as shown in FIG. 10, a second conductive material 72' such as WSi2, p+ polysilicon, etc, is deposited overlaying the dielectric layer 50, the sidewalls and the bottom of the contact trench 60 followed by a carrying out an anisotropic etch to form a conductive spacer 90' covering at least a lower portion of the sidewalls of the contact trench 60 and the bottom corners of the contact trench 60 leaving only a central portion of the bottom of the contact trench 60 exposed. The conductive spacer 90' formed from the second conductive material 72' has high work function characteristics and is in contact with the heavy-doped p type region 41 inside the body region 40 at the sidewalls and the bottom corners of the contact trench 60 therefore forming ohmic contact in these areas.

Then in step (i), the spacer layer 90' is used as the mask to space away the B+ p-type region 41 and the p type body region 40 along the sidewalls and at the bottom corners of the contact trench 60 from n type ion implantation into the central portion of the bottom of the contact trench to form an n− drift region 25 right under the central portion of the bottom of the contact trench connecting to the n− epitaxial layer 20 to ensure that n type dopant region extends from the bottom of n+ substrate 10 reaching to the central bottom portion of the contact trench. As shown in FIG. 10, the central portion of the bottom of the contact trench 60 is contacted with the n-epitaxial layer 20 through drift region 25; while the bottom corners of the contact trench 60 are surrounded by the B+ boron p type region 41 in the p type body region 40.

Figure 11:
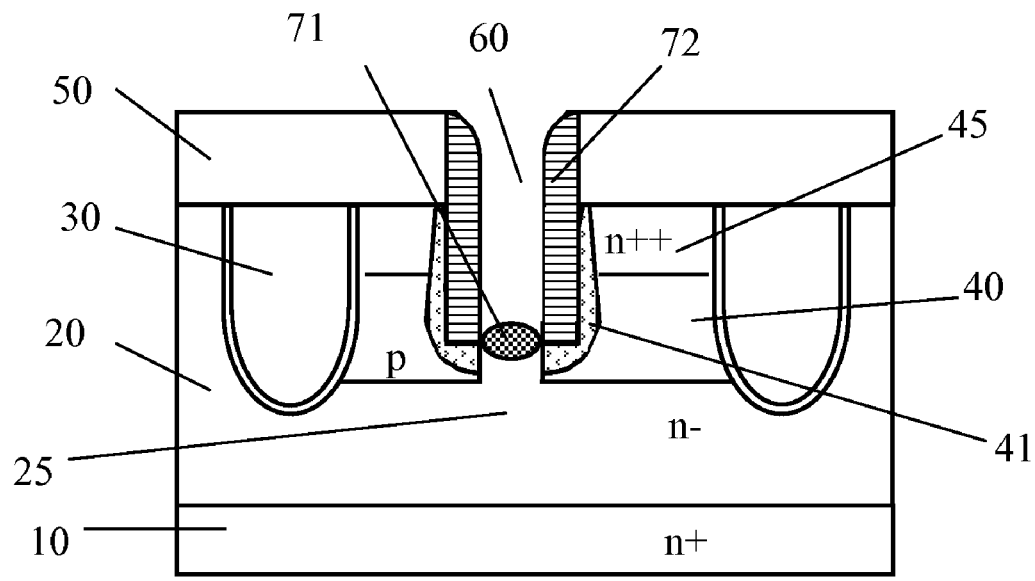

As shown in FIG. 11, the spacer 90' is also used as a mask in step (j) where a first conductive material with medium work function is disposed on a central portion of the bottom of the contact trench 60 in contact with drift region 25 to form the Schottky contact layer 71. In one embodiment, a metal such as Ti or Ta is deposited on the top of the dielectric layer 50 as well as on the sidewalls of the spacer 90 and the central bottom portion of the contact trench. The deposited Ti or Ta metal reacts with Si in the central bottom portion to form a silicide at an elevate temperature while the Ti or Ta metal overlaying dielectric layer 50 and spacer 90' remains unchanged and is removed in a following etching process, leaving only silicide as a first conductive material in the central bottom portion of the contact trench to form the Schottky contact layer 71 with the N drift region 25 with improved rectification effect.

As shown in FIG. 12, contact metal layer 80 is subsequently deposited to cover the ohmic contact layer 72' (or the conductive spacer 90') at the sidewall of the contact trench 60 and the Schottky contact layer 71 in the bottom of the contact trench 60 without going through step (k) and (l) of embodiment 1 to remove the spacer and deposit an ohmic contact layer of second conductive material. The contact metal layer fills in the contact trench 60 and extends over the top surface of the dielectric layer 50. After that, manufacturing of the whole power MOSFET device provided with the B+ boron P-type region 41 can be finished according to standard procedure.

Alternatively the manufacturing of the structure without p+ region 41 surrounding the side wall and the bottom corners of the contact trench 60 can follow the same step of process by skipping step (g)

The manufacturing method provided by this invention is also suitable for P channel power MOSFET device as long as adopting semiconductor layer and dopant with polarity opposite to the embodiments described above.

As shown in the embodiment 1 and the embodiment 2, the power MOSFET device and the manufacturing method thereof presented by this invention provide an ohmic contact layer 72 through deposition of a second conductive materials with high work function characteristics in contact with the heavy-doped p region 41 inside the body region 40 on the sidewall and bottom corner of the contact trench 60, and a Schottky contact layer 71 through deposition of a first conductive material with medium work function in contact with a source doing region under a central bottom portion of the contact trench 60. The first conductive material is different from the second conductive material. Therefore, this invention can simultaneously provide the characteristic of small resistance of the ohmic contact and rectification characteristic of the Schottky contact by constructing two totally different interfaces in the same contact trench 60.

Moreover, as the Schottky contact is only located in a central portion at the bottom without reaching the bottom corner of the of contact trench, the consistency of Schottky contact effectively improved. Further as the bottom corner of the contact trench 60 is surrounded by the body region or the B+ boron p-type iron implantation region in the body region, the reverse leakage current at the corner position of the contact trench 60 is greatly reduced.

Although the content of this invention is specifically introduced through the preferable embodiments, the description shall not be considered as limitation to this invention. Many variations and replacements are obvious to the technical personnel in this field after reading the content. Therefore, the protection scope of this invention shall be defined by the attached Claims.

What is claimed is:

1. A method for manufacturing a power MOSFET device comprises the following steps:

Forming an epitaxial layer lightly doped with dopants of first conductivity on a bottom substrate heavily doped with dopants of the first conductivity;

Implanting dopants of second conductivity into the epitaxial layer to form a body region;

Forming a trench gate in the epitaxial layer;

Implanting dopants of first conductivity in an upper part of the epitaxial layer to form a heavily doped source region;

Forming a dielectric layer on top of the epitaxial layer;

Etching a contact trench through the dielectric layer and the source region into the body region in the epitaxial layer;

Forming sidewall spacers along the sidewalls and bottom corners of the contact trench;

Depositing a first conductive material at a central portion of the bottom of the contact trench not covered by the spacer;

Depositing a contact metal layer filling the contact trench and overlaying the dielectric layer.

2. The method of claim 1 further comprising a step of implanting dopants of second conductivity into sidewalls and bottom corners of the contact trench with an angle before forming spacers along the sidewalls and bottom corners of the contact trench region.

3. The method of claim 1 further comprising a step of implanting dopants of first conductivity into the bottom of the contact trench after the formation of spacers using the spacers as a mask.

4. The method of claim 1 wherein the step of forming sidewall spacer further comprises steps of depositing a dielectric material inside the contact trench and anisotropicaly etch back to form spacers along the sidewalls and the bottom corners of the contact trench and exposing the central portion of the bottom of the contact trench.

5. The method of claim 4 further comprises a step of removing the spacers after the step of depositing the first conductive material in the central portion of the bottom of the contact trench.

6. The method of claim 5 further comprises a step of depositing a second conductive material along the sidewalls and bottom corners of the contact trench to form ohmic contact with the source and the body regions before deposition of the contact metal layer.

7. The method of claim 1 wherein the step of forming spacer further comprises steps of depositing a second conductive material inside the contact trench and aniso-tropicaly etch back to form spacers along the sidewalls and the bottom corners of the contact trench and exposing the central portion of the bottom of the contact trench.

8. The method of claim 7 wherein the second conductive material forms ohmic contact with the body region.

9. The method of claim 7 wherein the second conductive material comprises a WSi2 or a doped poly silicon.

10. The method device of claim 1 wherein the first conductive material comprises a silicide layer of Ti or Ta or Ni.

11. The method of claim 10 wherein the first conductive material forms a Schottky contact with a doped region of first conductivity right under the central portion of the contact trench.

* * * * *